United States Patent [19]
Dunn

[11] 3,936,810
[45] Feb. 3, 1976

[54] SENSE LINE BALANCING CIRCUIT
[75] Inventor: William C. Dunn, Scottsdale, Ariz.
[73] Assignee: Semi, Inc., Phoenix, Ariz.
[22] Filed: Jan. 20, 1975
[21] Appl. No.: 542,395

[52] U.S. Cl. ......... 340/173 FF; 340/173 R; 307/238
[51] Int. Cl.² .......................................... G11C 11/40
[58] Field of Search ................. 340/173 R, 173 FF; 307/238

[56] References Cited
UNITED STATES PATENTS
3,693,170   9/1972   Ellis et al. ..................... 340/173 FF Primary Examiner—Terrell W. Fears
Attorney, Agent, or Firm—Lindenberg, Freilich, Wasserman, Rosen & Fernandez

[57] ABSTRACT

In semiconductor memory cells of the type including flip flop circuits in each cell and two sense output lines for determining the binary bits stored in the cell, an attempt to read data stored in the cell after a previous operation, before the sense lines have been fully restored to their quiescent state can result in the loss of data. This invention provides a means for restoring the sense lines very rapidly after an operation so that loss of data is prevented and the memory may be accessed at a higher frequency.

4 Claims, 2 Drawing Figures

SENSE LINE BALANCING CIRCUIT

BACKGROUND OF THE INVENTION

This invention relates to semiconductor memories and more particularly to improvements therein.

In semiconductor memories of the type having an array of elements each of which effectively constitutes a flip flop for binary data storage, it is customary to use two sense lines for say, each column of elements in the array. When a row of elements in an array is accessed for read out, one of the sense lines for each element is high and the other is low, indicative of the information stored in each element. When another row of elements is accessed for read out, the same sense lines as were used for the previous access row are excited again in response to the information contained in the latest access row.

It can happen that if insufficient time is allowed to permit the sense lines to recover from a previous read out, they do not settle back to their quiescent state. The voltage levels which the nonrecovered sense lines have at the time of a second read out may be such as to cause the memory to lose the data that is stored therein. That is, the voltage level on the nonrecovered sense lines acts to change the data stored in the memory.

It will be apparent that the need for time for the memory to "settle down" after a read out operation reduces the speed at which the memory can be operated.

OBJECTS AND SUMMARY OF THE INVENTION

It is an object of this invention to provide a method and means for shortening the recovery time required for sense lines after a read out operation.

It is another object of this invention to provide an arrangement whereby a semiconductor memory can be operated more rapidly.

It is yet another object of this invention to provide an arrangement which prevents the loss of memory data due to unrecovered sense lines.

The foregoing and other objects of the invention are achieved by providing a circuit interconnecting the two sense lines for a given column of elements in a semiconductor memory array which functions to equalize the potential of the two sense lines in the interval between accessing the memory elements.

The novel features of the invention are set forth with particularity in the appended claims. The invention will best be understood from the following description when read in conjunction with the accompanying drawings.

DESCRIPTION OF THE PREFERRED EMBODIMENTS

Figure 1:
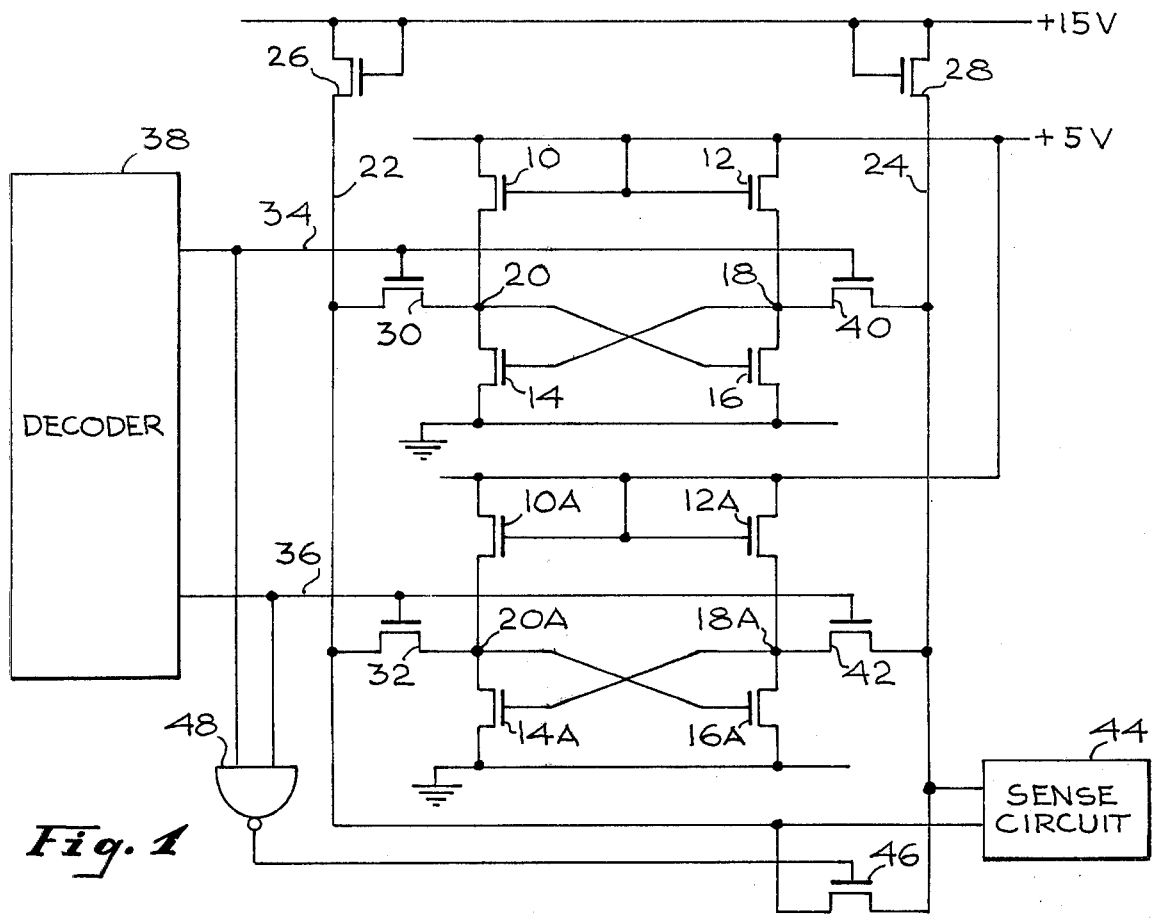
FIG. 1 is a circuit diagram illustrating the embodiment of the invention.

Two memory elements are shown in FIG. 1, by way of example. Each of these includes two FETs respectively, 10, 12, 10A, 12A. These have their respective source electrodes connected to a positive voltage source, for example, +5 volts, and their gate electrodes are connected together to this positive voltage source. These FETs are connected so that they are always biased on. FETs 10 and 10A respectively have their drain electrodes connected to the source electrodes of FETs 14 and 14A. The drain electrodes of these FETs are connected to ground. FETs 12 and 12A have their drain electrodes respectively connected to the source electrodes of FETs 16 and 16A. The drain electrodes of FETs 16 and 16A are connected to ground. The gate electrodes of FETs 14 and 14A are respectively connected to the source electrodes of FETs 16 and 16A establishing nodes respectively 18 and 18A at the point of connection. The gate electrodes of FETs 16 and 16A are connected to the source electrodes of FETs 14 and 14A respectively, establishing nodes respectively 20, 20A at the point of connection.

First and second sense lines respectively 22, 24, have one of their ends connected to the drains of respective FETs 26, 28, the sources of which are connected to a second high voltage source of potential (+15 volts, by way of example). FETs 26 and 28 are biased on by having their gate electrodes also connected to the 15 volt source of potential. The first sense line 22 is connected through the respective FETs 30, 32, to the respective nodes 20 and 20A of the two memory elements. The respective gate electrodes of FETs 30 and 32 are respectively connected to lines 34 and 36, which are connected to a decoder 38.

The second sense line 24 is connected through respective FETs 40, 42, to the respective nodes 18, 18A. The respective gates of FETs 40, 42 are connected to the sense lines 34, 36 also. The sense circuit 44 is connected to the first and second sense lines 22 and 24.

As thus far described, the circuit in FIG. 1 is an example of a circuit of memory elements used in present day semiconductor memories.

When decoder 38 applies a voltage to line 34, in order to read the data stored in the first memory element out on the two sense lines 22, 24, FETs 30 and 40 are turned on. From a previous write cycle, either FET 14 or FET 16 will have been left turned on representative of the data stored therein. It is assumed that the FET that was left turned on is FET 16. This will pull sense line 24 low, since it is effectively connected to ground through the turned on FET 16. However, sense line 22 will remain high since FET 14 is turned off. The high voltage for the sense line is about 12 volts and the low voltage for the sense line is about 2 volts. Node 20, taking into consideration the voltage drop across FET 30, assumes a potential of about 9 volts and node 18, taking into consideration a potential drop across FET 16 is on the order of 1 volt.

If access line 34, after a suitable read out interval has been provided for the sense circuit 44, is permitted to go low again and access line 36 is driven high, within an interval which does not permit sense line 24 to recover to its stand by voltage, sense line 24 at that time can be as low as 7 volts. If the information stored in the memory element was such that node 18A was high and node 20A low, i.e., 3 and 1 volts respectively under these conditions, the high sense line voltage which is applied through sense line 22 to node 20A, compared to the low sense line voltage applied to node 18A, will disturb the information stored in the memory element and will cause it to change states thereby losing the information stored.

In accordance with this invention, an FET 46 is connected between the sense lines 22 and 24. The gate of the FET 46 has a signal applied thereto between the application of turn on signals to access lines 34 and 36 so that it is turned on in the interim and enables the sense lines to reach the same potential at the time that the second access signal is applied to sense line 36 whereby the information stored in the memory element will not be disturbed.

The turn on signal for FET 46 is shown here as being derived by connecting the access lines 34 and 36 to a NOR gate 48, whose output is used to turn on the FET 46. Thus, whenever there are no drive pulses applied by the decoder to any of the access lines, the FET 46 is turned on to equalize the potential on the sense lines 22, 24. In practice the turn on signal for FET 46 may be derived from the chip select pulse used to turn the memory on.

Figure 2:
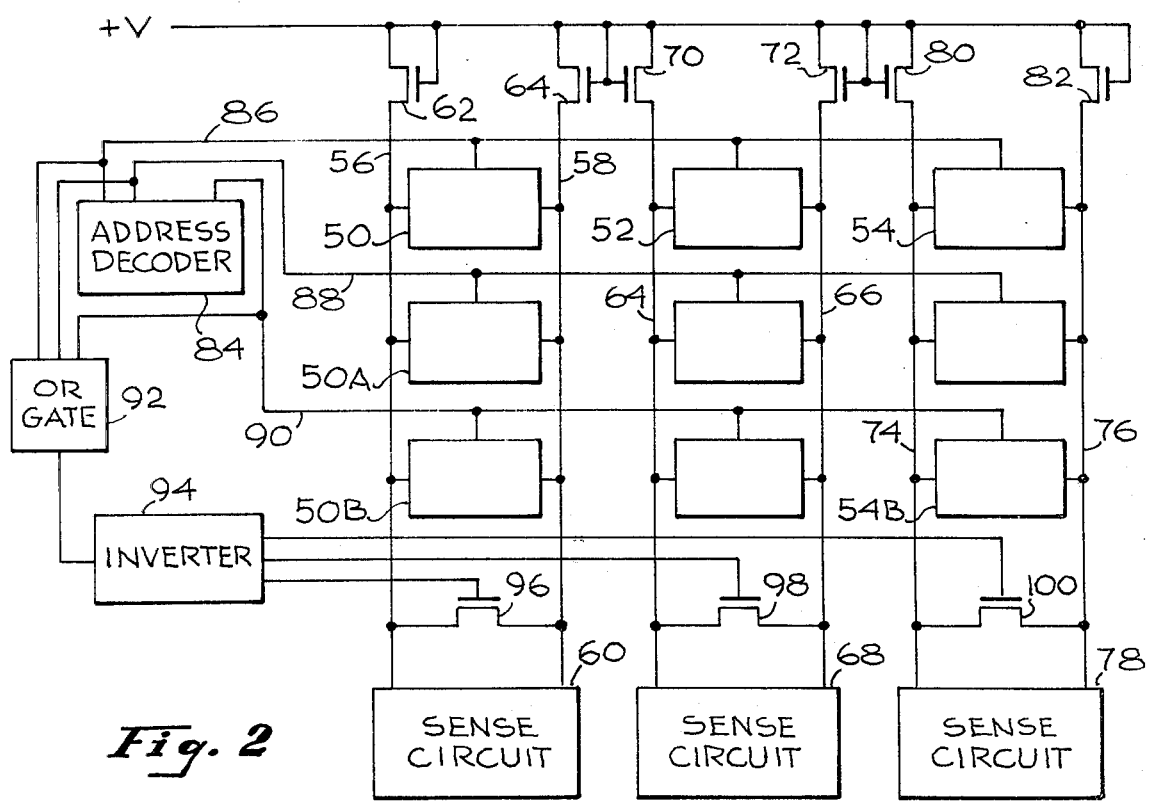
FIG. 2 is a block schematic drawing showing how the invention is applied to an entire semiconductor memory.

FIG. 2 shows how the embodiments of the invention may be applied to a typical semiconductor memory circuit of the type described. Shown in FIG. 2 is a 3 × 3 array of elements 50, 52, 54, by way of example. For the column of elements headed by element 50, two sense lines respectively 56, 58 are provided which are now connected to each of the elements in that column. At one end of the sense lines they are connected to a sensor 60. The other end of the sense lines are connected via FETs 62, 64, to a positive voltage source.

Similarly, two sense lines 64, 66, are connected to all of the elements in the column headed by the element 52, and have one of their ends connected to a sense circuit 68 and the other of their ends connected through FETs 70, 72, to the positive voltage source.

Sense lines 74, 76 are connected to all of the elements in the column headed by the memory element 54. The sense lines are connected to a sense circuit 78 at one end and have their other ends connected to the positive voltage source through FETs 80, 82.

An address decoder 84 selectively excites the drive lines respectively 86, 88, and 90, for the purpose of read out from the rows of memory elements. The address decoder is driven to address the memory by address buffers 92, 94, 96. These are selectively driven by an address data source 98. However, whenever the address buffers are to be driven, they are turned on by a pulse from a chip select pulse source 100. The output from the chip select pulse source 100 is also applied to an inverter 102. The output of the inverter 102 is applied to the gates of equalizing FETs respectively 104, 106 and 108. FET 104 is connected between the sense lines 56 and 58, and when enabled equalizes the voltage across these sense lines. FET 106 is connected across the sense lines 64 and 66 and when enabled equalizes the voltage between these two sense lines, and FET 108 is connected between sense lines 74 and 76 and when enabled equalizes the voltage between these sense lines.

When the address buffers are driven they drive the address decoder which in turn applies a drive or access voltage to one of the lines 86, 88 or 90. At this time a chip select pulse is also applied to the address buffers and to the inverter 102. The FETs 104, 106 and 108 are thereby kept off and will not affect the reading operation. In the absence of a chip select pulse, none of the access lines, 86, 88, 90, is driven and the inverter 102 will keep the FETs 104, 106, 108 on and they will equalize the potentials across the sense lines.

Accordingly, there has been described and shown above a new and useful arrangement for a semiconductor memory circuit whereby an equalization circuit is provided for the sense line which becomes operative in the interim between chip selection for read out whereby memory data is not lost due to unrecovered sense lines at the next read out.

The embodiments of the invention in which an exclusive property or privilege is claimed are defined as follows:

1. In a semiconductor memory of the type wherein there is an array of binary memory elements, for each column of elements there is provided a common pair of sense lines connected to each element, for each row of elements there being provided a common access line for enabling read out of the data stored in the elements connected thereto, the improvement comprising
   for each pair of sense lines, a separate means for equalizing voltages on said pair of sense lines during the intervals between actuation of said chip select lines for providing a read out from said memory.

2. In a semiconductor memory as recited in claim 1 wherein said means for equalizing the voltages between each pair of sense lines comprises
   an inoperative switch means connected between each pair of sense lines, and
   means for rendering all of said inoperative switch means operative for equalizing the potentials on each pair of sense lines, during the intervals between read out from the memory elements of said semiconductor memory.

3. In a semiconductor memory as recited in claim 2 wherein an inoperative switch means comprises an FET semiconductor having source, drain, and gate electrodes, and
   means connecting said source electrode to one of said sense lines and said drain electrode to the other of said sense lines, and
   means for applying a potential to said gate electrode for turning said FET on when no potential is applied to any of said chip select lines.

4. In a semiconductor memory as recited in claim 3 wherein said means for applying a potential to said gate electrode for turning said FET on when there is no potential applied to any one of the chip access lines comprises an inverter circuit having its output connected to the gate of said FET, and
   means for applying a signal to said inverter circuit to maintain its output low during the occurrence of read out from said memory.

* * * * *